United States Patent
Ueda et al.

(10) Patent No.: US 8,129,626 B2
(45) Date of Patent: Mar. 6, 2012

(54) MULTILAYER WIRING SUBSTRATE WITH A REINFORCING LAYER FOR PREVENTING A WARP

(75) Inventors: Natsuko Ueda, Nagano (JP); Yuji Yukiiri, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 405 days.

(21) Appl. No.: 12/399,450

(22) Filed: Mar. 6, 2009

(65) Prior Publication Data

US 2009/0236135 A1     Sep. 24, 2009

(30) Foreign Application Priority Data

Mar. 19, 2008   (JP) ................ P2008-070681

(51) Int. Cl.
*H05K 1/16*     (2006.01)

(52) U.S. Cl. ...................... 174/260; 174/264

(58) Field of Classification Search ............ 174/260, 174/266, 264
See application file for complete search history.

(56) References Cited

U.S. PATENT DOCUMENTS

| | | | | |
|---|---|---|---|---|
| 4,998,159 A * | 3/1991 | Shinohara et al. | ............ | 361/809 |
| 5,628,852 A * | 5/1997 | Ishida | ............ | 156/182 |
| 5,888,627 A * | 3/1999 | Nakatani | ............ | 428/209 |
| 6,534,723 B1* | 3/2003 | Asai et al. | ............ | 174/255 |
| 6,759,600 B2* | 7/2004 | Koyama et al. | ............ | 174/262 |
| 6,936,336 B2* | 8/2005 | Matsunaga et al. | ............ | 428/209 |
| 7,629,559 B2* | 12/2009 | Desai et al. | ............ | 219/507 |
| 7,893,360 B2* | 2/2011 | Sakamoto et al. | ............ | 174/260 |
| 2005/0126818 A1* | 6/2005 | Kojima et al. | ............ | 174/255 |
| 2009/0139760 A1* | 6/2009 | Tanaka | ............ | 174/264 |
| 2009/0229876 A1* | 9/2009 | Takahashi | ............ | 174/378 |

FOREIGN PATENT DOCUMENTS

| | | |
|---|---|---|
| JP | 2001-24338 | 1/2001 |
| JP | 2004-186265 | 7/2004 |
| JP | 2007-266136 | 10/2007 |

* cited by examiner

*Primary Examiner* — Hae Moon Hyeon
(74) *Attorney, Agent, or Firm* — Drinker Biddle & Reath LLP

(57) ABSTRACT

A multilayer wiring substrate having no core substrate is provided. The multilayer wiring substrate includes: a laminated body includes: a plurality of insulating layers; and a plurality of wiring layers. The laminated body has: a mounting surface on which a semiconductor element is mounted; and a bonding surface to which external connection terminals are bonded. At least one of the insulating layers contains a glass cloth.

4 Claims, 4 Drawing Sheets

MULTILAYER WIRING SUBSTRATE WITH A REINFORCING LAYER FOR PREVENTING A WARP

This application is based on and claims priority from Japanese Patent Application No. 2008-070681, filed on Mar. 19, 2008, the entire contents of which are hereby incorporated by reference.

BACKGROUND OF THE INVENTION

1. Technical Field

The present disclosure relates to a multilayer wiring substrate and a method of manufacturing the same and, more particularly, a coreless multilayer wiring substrate and a method of manufacturing the same.

2. Related Art

The multilayer wiring substrate used to mount the semiconductor element is formed by forming wiring layers in a multi-layered fashion on both surfaces of a core substrate formed of a resin substrate by means of the build-up method, or the like. The core substrate is used as the supporting base of the wiring layers. When the wiring layers are supported by the core substrate, the wiring layers can be formed in a multi-layered fashion through the build-up method, or the like.

Meanwhile, for the purpose of reducing a size of an electronic component such as a semiconductor device, or the like, a reduction in size and thickness is also required of the multilayer wiring substrate. The core substrate occupies about ½ of the multilayer wiring substrate in thickness. Therefore, in reducing a thickness of the multilayer wiring substrate, it is advantageous to form the multilayer wiring substrate only by using the wiring layers without the core substrate. Thus, the multilayer wiring substrate using no core substrate, i.e., the so-called coreless multilayer wiring substrate is being studied.

However, in the coreless multilayer wiring substrate, a shape-retaining property is lowered in contrast to the multilayer wiring substrate having the core substrate. For this reason, a means for retaining a shape of the wiring substrate is needed such that the wiring substrate is not warped. As the method of retaining a shape of the wiring substrate, there are a method of mounting a reinforcing member onto the wiring substrate, a method of preventing a warp by providing a reinforcing layer, a method of using a reinforcing resin material containing a glass cloth as the insulating layer, and others (see e.g., JP-A-2004-186265, JP-A-2007-266136 and JP-A-2001-24338)

From the aspect of a reduction in size and thickness of the multilayer wiring substrate, the method of providing the reinforcing layer or the reinforcing member separately from the wiring layers is not necessarily effective as the method of forming the coreless multilayer wiring substrate. On the contrary, the method of using the resin material containing the glass cloth as the insulating layer can retain the shape-retaining property of the multilayer wiring substrate. Also, there is no need to provide the reinforcing layer as another layer. Therefore, this method can attain a reduction in thickness effectively.

However, according to the resin material containing the glass cloth, in a situation that the wiring patterns should be formed extremely finely, such a problem existed that the glass cloth obstructs a formation of the wiring patterns with high accuracy. Further, when the coreless multilayer wiring substrate is formed using the resin material containing the glass cloth, another structure for achieving a reduction in thickness and preventing a deformation such as a warp is required.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a coreless multilayer wiring substrate using the resin material containing the glass cloth, which is capable of preventing a deformation such as a warp of the multilayer wiring substrate, achieving a reduction in thickness of the multilayer wiring substrate, and forming wiring patterns with high accuracy, and a method of manufacturing the same.

According to one or more aspects of the present invention, a multilayer wiring substrate having no core substrate is provided. The multilayer wiring substrate includes: a laminated body includes: a plurality of insulating layers; and a plurality of wiring layers. The laminated body has: a mounting surface on which a semiconductor element is mounted; and a bonding surface to which external connection terminals are bonded. At least one of the insulating layers contains a glass cloth.

According to one or more aspects of the present invention, there is provided a method of manufacturing a multilayer wiring substrate. The method includes: (a) pasting two supporting metal plates together; (b) forming wiring patterns having pads to which external connection terminals are to be bonded, on each of the supporting metal plates; (c) forming a laminated body on each of the supporting metal plates, wherein the laminated body comprises: a plurality of insulating layers; and a plurality of wiring layers, and at least one of the insulating layers contains a glass cloth; (d) separating the pasted supporting metal plates from each other; and (e) removing each of the supporting metal plates from the laminated body by selectively etching each of the supporting metal plates not to affect the wiring patterns.

DETAILED DESCRIPTION OF EXEMPLARY EMBODIMENTS OF THE INVENTION

Exemplary embodiments of the present invention will be explained in detail with reference to the drawings hereinafter.

Figure 1:
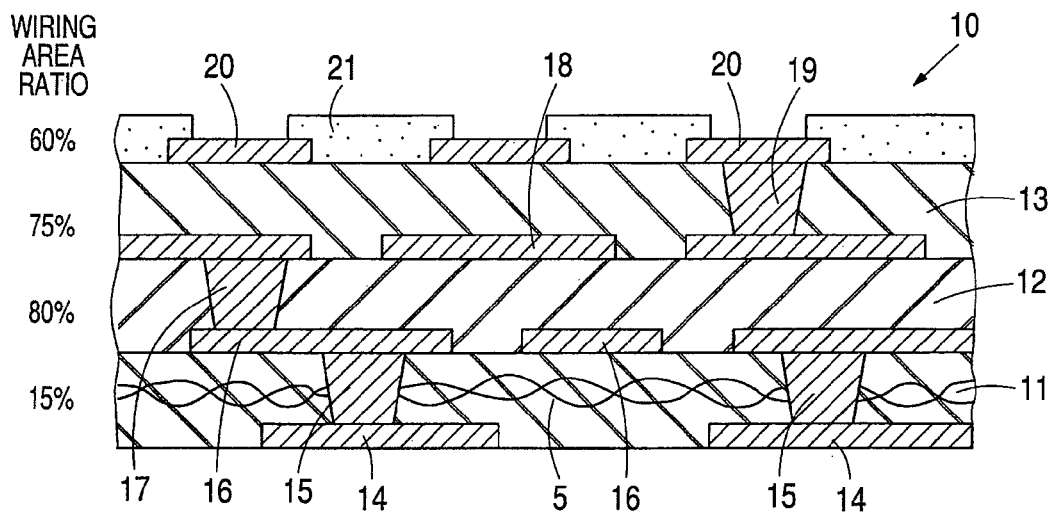
FIG. 1 is a sectional view showing a configuration of a multilayer wiring substrate according to an exemplary embodiment of the present invention.

FIG. 1 is a sectional view showing a configuration of a multilayer wiring substrate according to an exemplary embodiment of the present invention. A multilayer wiring substrate 10 illustrated is a coreless multilayer wiring substrate in which the insulating layers are formed as a three-layered structure. The insulating layers of the multilayer wiring substrate 10 are laminated together to form the structure. One surface of the multilayer wiring substrate 10 is formed as a mounting surface on which a semiconductor element is to be mounted, and the other surface is formed as a mounting surface to which external connection terminals are to be mounted.

The insulating layers constituting the multilayer wiring substrate 10 includes a first insulating layer 11, a second insulating layer 12, and a third insulating layer 13 from the bonding surface side of the external connection terminals. A first wiring pattern 14 having pads to which the external connection terminals are to be bonded respectively is formed on the first insulating layer 11, and first vias 15 for electrically connecting the first wiring pattern 14 and a second wiring pattern 16 are formed in the first insulating layer 11. The first wiring pattern 14 is formed to expose from an outer surface (lower surface) of the first insulating layer 11, and the first vias 15 are provided to pass through the first insulating layer 11 in a thickness direction.

The second wiring pattern 16 is formed on the boundary between the second insulating layer 12 and the first insulating layer 11. Also, a second via 17 for electrically connecting the second wiring pattern 16 and a third wiring pattern 18 is formed in the second insulating layer 12.

The third wiring pattern 18 is formed on the boundary between the third insulating layer 13 and the second insulating layer 12. Also, a third via 19 for electrically connecting the third wiring pattern 18 to a connection pad 20 formed in a next layer is formed in the third insulating layer 13.

The connection pads 20 are the pads to which electrodes of the semiconductor element are to be connected. The surface of the third insulating layer 13 on which the connection pads 20 are formed is covered with a protection film 21 to expose the connection pads 20.

With the above configuration, the wiring layers of the multilayer wiring substrate 10 of the exemplary embodiment is constructed as a four-layered structure in which the first wiring pattern 14, the second wiring pattern 16, the third wiring pattern 18, and the connection pads 20 respectively. The first vias 15, the second vias 17, and the third vias 19 electrically connect the wiring layers respectively.

According to the multilayer wiring substrate 10 of the present embodiment, out of the first to third insulating layers 11 to 13 constituting the multilayer wiring substrate 10, only the first insulating layer 11 to which the external connection terminals are to be bonded is formed by the resin material containing a glass cloth 5 and the second insulating layer 12 and the third insulating layer 13 are formed by the resin material not containing the glass cloth. The reason why the resin material containing the glass cloth 5 is used as the first insulating layer 11 is that the multilayer wiring substrate 10 of the present embodiment does not contain the core substrate and therefore the insulating layers are reinforced by the glass cloth 5 to ensure a shape-retaining property of the multilayer wiring substrate 10 as a whole.

The glass cloth is used widely as the reinforcing material of the resin substrate, and also used in the resin substrate acting as the core substrate as the reinforcing material. According to the multilayer wiring substrate 10 of the present embodiment, the resin material containing the glass cloth is used as the insulating layers themselves that insulate the wiring layers between the layers, and the resin material containing the glass cloth is used only as the insulating layer (the insulating layer that faces the outermost surface on the opposite side to the semiconductor element mounting surface of the multilayer wiring substrate), on which the pads to which the external connection terminals are to be connected, out of the insulating layers constituting the multilayer wiring substrate 10.

Each thickness of the first to third insulating layers 11 to 13 constituting the multilayer wiring substrate 10 can be set appropriately. But it is advantageous that the thicknesses of the insulating layers should be set thinner so that the wiring patterns can be formed as a fine pattern with high accuracy. For example, when a ratio of pattern width/pattern interval of the wiring patterns is set to 30 μm/30 μm or less, a thickness of the insulating layer must be set to about 30 μm or less.

Figure 2:
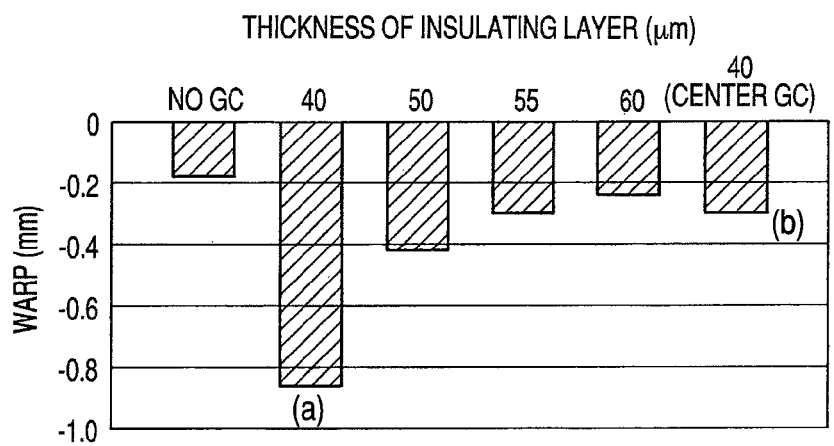
FIG. 2 is a graph showing the measured results of an amount of warp of the multilayer wiring substrate according to the exemplary embodiment of the present invention.

FIG. 2 shows the measured results of an amount of warp of the multilayer wiring substrate 10. In more detail, FIG. 2 shows how a warp of the multilayer wiring substrate 10 appears depending on a thickness of the first insulating layer 11. According to a measurement condition, the multilayer wiring substrate is formed under conditions that the resin material containing the glass cloth 5 is used as the first insulating layer 11, a build-up resin not containing the glass cloth (thickness 30 μm) is used as the second insulating layer 12 and the third insulating layer 13, and a solder resist having 25 μm thickness is used as the protection film 21. Besides, the glass cloth used in the first insulating layer 11 has thickness 16 μm, specific gravity 19.5 ($g/cm^3$), single fiber diameter 4 μm, 100 (number of single fibers/yarn), and 75×75 (count/inch).

As shown in FIG. 2, when a thickness of the first insulating layer 11 was set to 40 μm ((a) in FIG. 2), an amount of warp was about 0.87 mm. When a thickness of the first insulating layer 11 was set to 50 μm, an amount of warp was about 0.42 mm. When a thickness of the first insulating layer 11 was set to 55 μm and 60 μm, an amount of warp was reduced to about 0.3 mm and 0.25 mm respectively.

Figure 3:
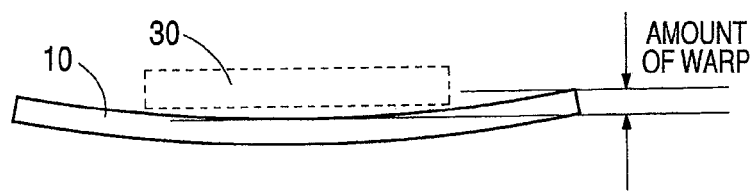
FIG. 3 is an explanatory view showing the warping direction and an amount of warp of the multilayer wiring substrate according to the exemplary embodiment of the present invention.

As shown in FIG. 3, the multilayer wiring substrate 10 of the present embodiment was warped like a bow, when viewed from the mounting surface side of a semiconductor element 30. An amount of warp is indicated by a difference between a bottom surface of the bow and a height of an end edge of the multilayer wiring substrate 10.

Also, for the sake of reference, the measured result obtained when the multilayer wiring substrate was formed by the resin material not containing the glass cloth (no GC) as the first insulating layer 11 is shown in FIG. 2. When this resin material not containing the glass cloth was used, an amount of warp was about 0.19 mm. Thus, an amount of warp was reduced smaller than the case where a thickness of the first insulating layer 11 was set to 60 μm. The reason why an amount of warp of the multilayer wiring substrate was suppressed using the resin material not containing the glass cloth as the first insulating layer 11 may be considered such that properties of materials of the insulating layers constituting the multilayer wiring substrate became homogeneous and as a result stresses were balanced wholly over the multilayer wiring substrate.

In this case, when the glass cloth was not used as the insulating layer, a shape-retaining property of the multilayer wiring substrate was degraded. Therefore, such wiring substrate is not suitable for the use of the multilayer wiring substrate on which the semiconductor element is to be mounted.

Also, an amount of warp of the multilayer wiring substrate when a thickness of the first insulating layer 11 is set to 40 μm and the resin material containing the glass cloth is used as a center layer in a thickness direction of the multilayer wiring substrate 10((b) in FIG. 2) is shown in FIG. 2.

Here, the case where the resin material containing the glass cloth was used as the center layer of the wiring substrate was compared with the case where the resin material containing the glass cloth was used as the outermost layer (the first insulating layer) to which the external connection terminals of the wiring layers are to be bonded. Thus, even though the resin material containing the glass cloth was used as the outermost layer of the wiring substrates an amount of warp could be reduced equally to that in the case where the resin material containing the glass cloth was used as the center layer, by setting a thickness of the insulating layer to 50 μm or more (55 μm, 60 μm).

Since the second wiring pattern 16 is formed on the surface of the first insulating layer 11 of the multilayer wiring substrate 10, the glass cloth should not be exposed from the surface of the first insulating layer 11 containing the glass cloth 5. This is because, when the glass cloth is exposed from the surface of the insulating layer, the surface of the insulating layer becomes uneven and it is difficult to form the fine wiring patterns with high accuracy, an electric insulation performance on the surface of the insulating layer is degraded and an electric insulation between the wiring patterns is not ensured, and thus such a situation is obstructed that the wiring patterns should be formed at a fine interval.

In this manner, for the purpose of forming the wiring patterns on the insulating layer with high accuracy, it is advantageous to avoid a situation that the glass cloth is exposed from the surface of the insulating layer.

Figure 4:
FIG. 4 is an electron microphotograph showing a cross-section of an insulating layer.

FIG. 4 is an electron microphotograph showing an example of arrangement of the glass cloth in the insulating layers. In FIG. 4, the glass cloth is located near the center in the thickness direction of the insulating layers, and an interval between the glass cloth and the surface of the insulating layer is kept.

Figure 5:
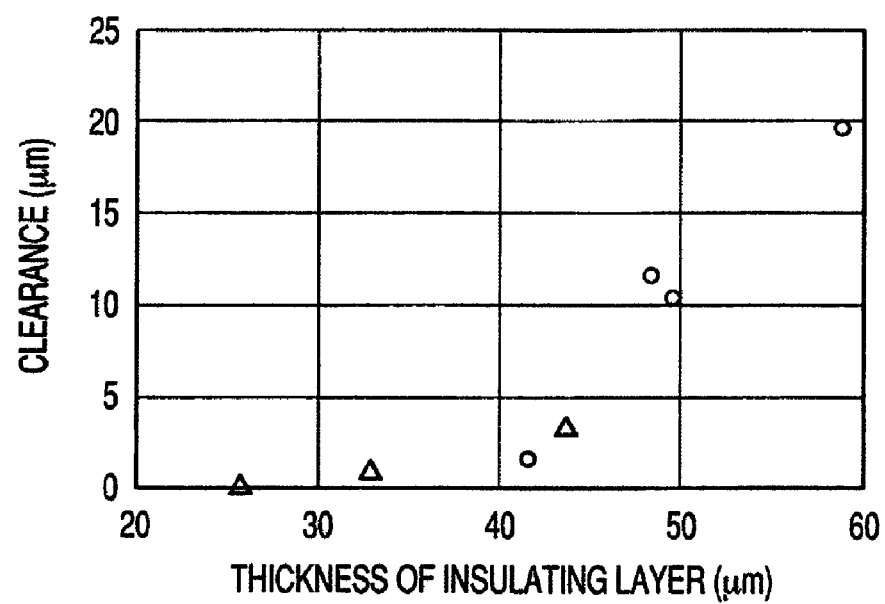
FIG. 5 is a graph showing the measured results of a clearance between a glass cloth and a surface of the insulating layer.

FIG. 5 shows the measured results of a clearance between the glass cloth and the surface of the insulating layer in the situation that the insulating layer is formed by the resin film containing the glass cloth.

According to the measured results in FIG. 5, a clearance between the glass cloth and the surface of the insulating layer becomes narrow as a thickness of the insulating layer is thinned. On the contrary, a clearance between the glass cloth and the surface of the insulating layer becomes wide as a thickness of the insulating layer is thickened.

When the multilayer wiring substrate is formed, a clearance (separation interval) between the glass cloth and the surface of the insulating layer in excess of about 10 to 15 μm must be kept empirically. According to the experimental results shown in FIG. 5, a thickness of the insulating layer should be set to about 50 μm or more to ensure a clearance in such extent.

In case a displacement of the glass cloth in the resin film containing the glass cloth, a variation in weave of the cloth, a displacement of the glass cloth in laminating the resin film by applying a pressure and a heat, etc. are taken into consideration, the wiring patterns can be formed on the fine patterns when about 50 μm or more is kept as a thickness of the insulating layer.

As described above, when a thickness of the insulating layer is set to 50 μm or more, a warp of the multilayer wiring substrate can be suppressed. Such thickness of the insulating layer is advantageous from this point.

As shown in FIG. 1, in the multilayer wiring substrate 10 of the present embodiment only the first insulating layer 11 on which the external connection terminals are to be formed is formed of the resin material containing the glass cloth. This insulating layer containing the glass cloth is different in physical properties from other insulating layers. Therefore, when the insulating layers are formed in a multi-layered fashion, the method of using the insulating layer containing the glass cloth whose physical properties are different from other insulating layers as the center layer and then arranging symmetrically other insulating layers on both sides is advantageous in suppressing a warp of the multilayer wiring substrate as a whole.

In contrast, according to the present embodiment, a warp of the multilayer wiring substrate as a whole is suppressed by using the insulating layer containing the glass cloth as the first insulating layer 11, setting a layer configuration of the insulating layers as an asymmetrical arrangement on purpose, and forming the thicker insulating layer containing the glass cloth.

Also, according to the multilayer wiring substrate 10 of the present embodiment, since the insulating layer containing the glass cloth is used as the first insulating layer 11 whose alignment density of the wiring patterns is the lowest out of the multilayer wiring substrate 10, such a situation can also be prevented that the wiring patterns should be formed on the insulating layer containing the glass cloth at a high density.

On the left side in FIG. 1, alignment densities of the wiring patterns (wiring area ratios) in respective wiring layers are given. Since the wiring area ratio of the wiring layers in the multilayer wiring substrate is different every product, such wiring area ratio cannot be defined uniquely. Normally, a wiring area ratio of the wiring layers constituting the pads, to which the external connection terminals are bonded, becomes lower than that of other wiring layers. In an example in FIG. 1, a wiring area ratio of the first to third wiring patterns are 15%, 80%, 75% respectively, and a wiring area ratio of the mounting surfaces of the connection pads 20 is 60%. Thus, a wiring area ratio of the layer on which the external connection terminals are formed is considerably lower than that of other layers.

In this manner, a wiring area ratio of the layer having the wiring patterns to which the external connection terminals are bonded is lower than that of other layers. Hence, even though the resin material containing the glass cloth is used as the insulating layer constituting the wiring layer, the purpose of forming the wiring patterns at a high density and with high accuracy is never disturbed.

Advantages of the configuration of the multilayer wiring substrate 10 explained as above are summarized as follows.

(1) The insulating layer constituting the multilayer wiring substrate is formed by using the resin material containing the glass cloth. Therefore, strength of the multilayer wiring substrate as a whole can be ensured.

(2) Although the insulating layer containing the glass cloth becomes thicker than other insulating layers, only the wiring layer to which the external connection terminals are to be bonded is formed of the insulating layer containing the glass cloth and other layers are formed of the conventional insulating layer. Therefore, a thickness of the multilayer wiring substrate can be suppressed as a whole, and the slimming-down of the multilayer wiring substrate can be attained.

(3) A thickness of the insulating layer containing the glass cloth is set such that a clearance between the glass cloth and the surface of the insulating layer is in excess of 10 mµ. Therefore, the wiring patterns can be formed as the fine patterns with high accuracy while ensuring an electric insulation between the wiring patterns.

(4) The insulating layer containing the glass cloth is applied to the wiring layer to which the external connection terminals are bonded. Therefore, the high-density wirings in the multilayer wiring substrate can be manufactured.

In the above embodiment, the example where the insulating layer containing the glass cloth is used as only the first insulating layer 11 is illustrated. In this event, as the method of suppressing a warp of the multilayer wiring substrate as a whole not to expose the glass cloth from the surface of the insulating layer containing the glass cloth while keeping a strength of the multilayer wiring substrate as a whole, the multilayer wiring substrate can be formed by using the insulating layer containing the glass cloth as at least one of the insulating layers constituting the multilayer wiring substrate, and then setting a thickness of the insulating layer such that a clearance between the glass cloth and the surface of the insulating layer is in excess of 10 to 15 µm.

In this case, the insulating layers constituting respective wiring layers become thicker than the insulating layer that does not contain the glass cloth in the related art. Therefore, a thickness of the multilayer wiring substrate as a whole becomes thicker than the multilayer wiring substrate in the above embodiment, nevertheless a strength of the multilayer wiring substrate as a whole can be improved further and thus the multilayer wiring substrate that enables the high-density wirings can be provided.

FIGS. 6A to 7B show a method of manufacturing the multilayer wiring substrate explained as above and shown in FIG. 1.

Figure 6A:
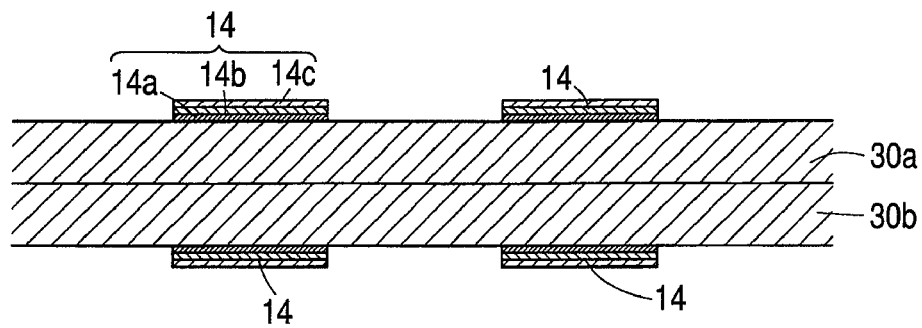
FIGS. 6A to 6C are sectional views showing steps of manufacturing the multilayer wiring substrate according to the exemplary embodiment of the present invention.

FIG. 6A shows a state that two sheets of supporting metal plates 30a, 30b formed of a copper plate are pasted together and the first wiring pattern 14 serving as the pads to which the external connection terminals are to be bonded is formed on surfaces of the supporting metal plates 30a, 30b respectively.

The first wiring pattern 14 is constructed by forming a gold plating layer 14a as the layers that contact the supporting metal plates 30a, 30b respectively, and then laminating a nickel plating layer 14b and a copper plating layer 14c sequentially on the gold plating layer 14a.

Then, a resist layer is formed on surfaces of the supporting metal plates 30a, 30b. Then, resist patterns from which portions, on which the pads are formed respectively, of the surfaces of the supporting metal plates 30a, 30b are exposed are formed by exposing and developing the resist layer. Then, the gold plating layer 14a, the nickel plating layer 14b, and the copper plating layer 14c are stacked sequentially by the electrolytic plating using the supporting metal plates 30a, 30b as a power feeding layer, while using the resist patterns as a mask.

The gold plating layer 14a is a layer that is exposed to the outer surface of the multilayer wiring substrate, and serves as the pad protecting layer. The nickel plating layer 14b is a barrier layer that causes the gold plating layer 14a not to diffuse into the copper plating layer 14c. The copper plating layer 14c acts as a main portion of the conductor portions used for the electrical connection.

The supporting metal plates 30a, 30b are used as a supporting base when the insulating layers and the wiring layers are formed in the manufacturing step of the multilayer wiring substrate. The metal plate having a thickness of about 0.3 mm is used as the supporting metal plates 30a, 30b.

Figure 6B:
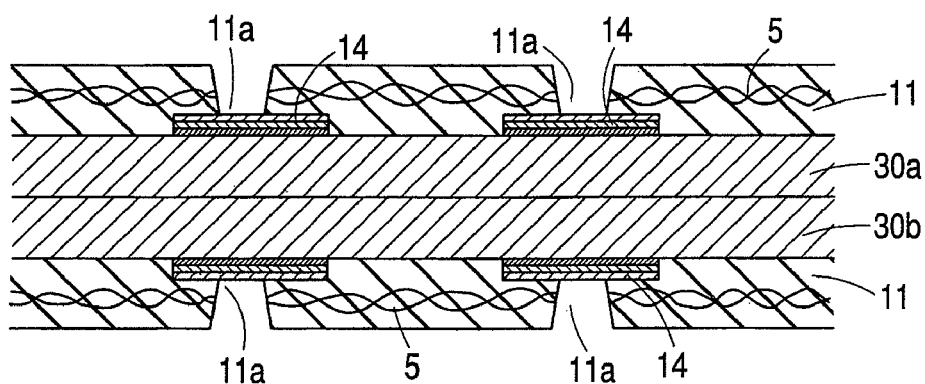

FIG. 6B shows a state that the resin film containing the glass cloth is arranged on the surfaces of the supporting metal plates 30a, 30b on which the first wiring patterns 14 are formed, then the first insulating layer 11 is formed by applying a pressure and a heat, and then via holes 11a are formed by the laser beam machining.

As the resin film containing the glass cloth, as described above, the resin film whose thickness is about 50 µm is used. The resin film is laminated by applying the heating to such extent that the resin material in the resin film containing the glass cloth is melted. After the resin film is cured from the heating, the via holes 11a are formed in the film to form the first insulating layer 11.

Figure 6C:
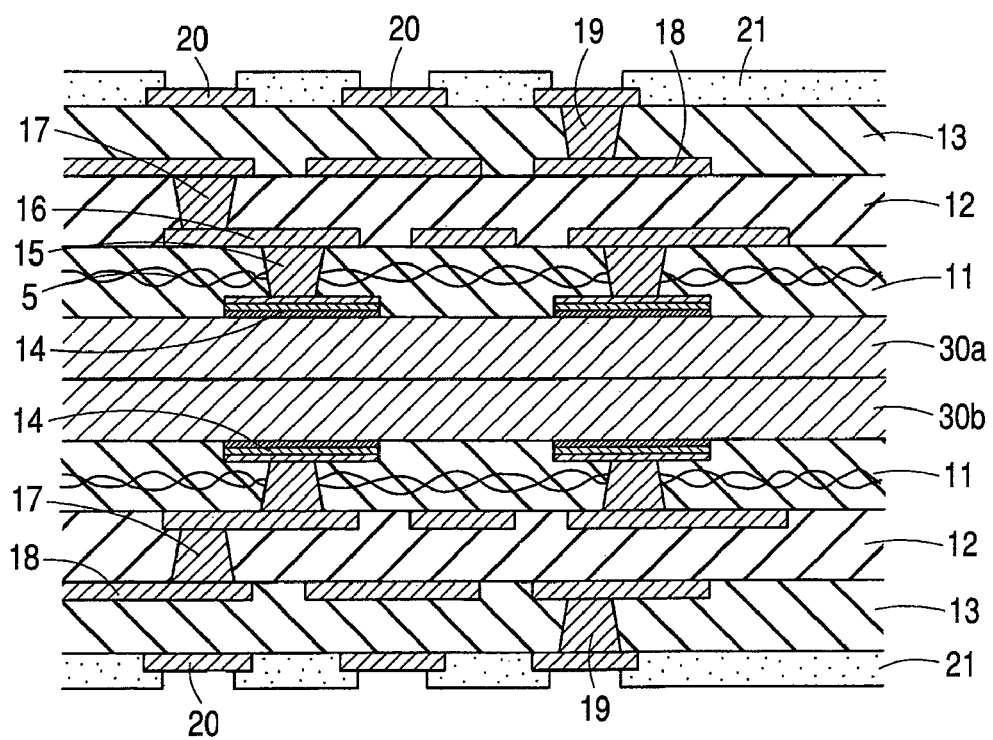

FIG. 6C shows a state that the wiring layers are stacked sequentially on the upper layer of the first insulating layer 11 by the build-up method.

Respective wiring layers can be formed by the semi-additive process.

For example, in order to form the first vias 15 and the second wiring patterns 16 from a state shown in FIG. 6B, firstly, a plating seed layer is formed on the surface of the first insulating layer 11 including inner surfaces of the via holes 11a by the electroless copper plating, the sputtering process, or the like. Then, the resist pattern is formed in conform with the second wiring patterns 16 on the surface of the first insulating layer 11. Then, a plating layer is formed in the recesses in the resist pattern where the first vias 15 and the second wiring patterns 16 are to be formed, by applying the electrolytic plating using the plating seed layer as a plating power feeding layer. Thus, the conductor layer shaped into the first vias 15 and the second wiring patterns 16 is formed. Then, the resist pattern is removed, and the plating seed layer exposed from the surface of the first insulating layer 11 is removed. Thus, the second wiring patterns 16 are formed as independent patterns.

Similarly, the wiring layers are formed while stacking sequentially the second insulating layer 12 and the third insulating layer 13. In the present embodiment, as the resin film used as the second insulating layer 12 and the third insulating layer 13, the resin film does not contain the glass cloth and is used in the normal build-up steps.

After the connection pads 20 are formed on the surface of the third insulating layer 13, the protection film 21 is formed by depositing a photosensitive solder resist on the surface of the third insulating layer 13, and then exposing and developing the solder resist to expose the connection pads 20.

In building up these wiring layers, as shown in FIG. 6C, the wiring layers are formed symmetrically to both the supporting metal plates 30a, 30b.

Here, at least one of the second insulating layer 12, the third insulating layer 13, and the first insulating layer 11 can be formed of the insulating layer containing the glass cloth. In this case, in forming the build-up layer by forming the wiring layers on the supporting metal plates 30a, 30b formed on the first wiring pattern 14, the resin film containing the glass cloth (the resin material) may be used as the insulating layer containing the glass cloth.

Figure 7A:
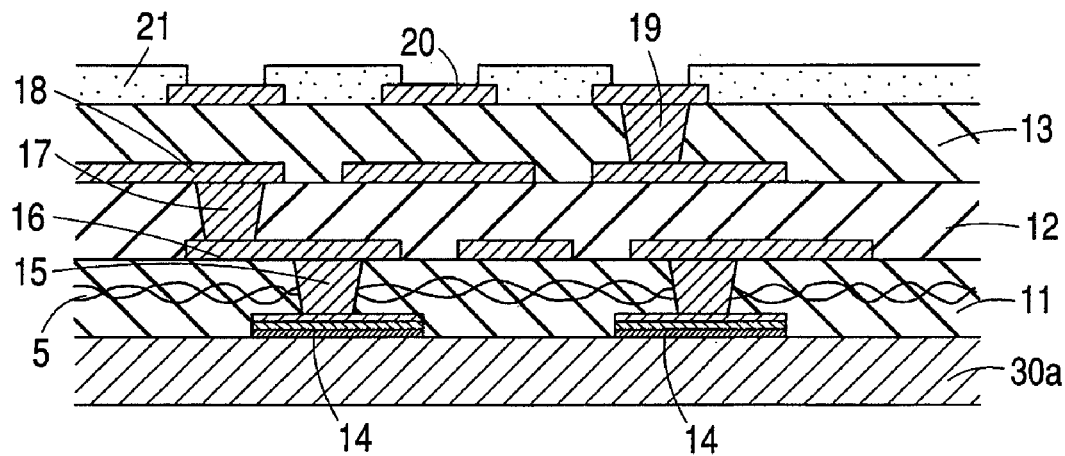
FIGS. 7A and 7B are sectional views showing steps of manufacturing the multilayer wiring substrate according to the exemplary embodiment of the present invention.

FIG. 7A shows a state that the wiring layers are formed on the supporting metal plates 30a, 30b and then the supporting metal plates 30a, 30b are separated along the pasted portion (FIG. 7A shows the separated one). When the supporting metal plates 30a, 30b are separated into two parts, the build-up layer supported on the supporting metal plates 30a, 30b is obtained respectively.

Figure 7B:
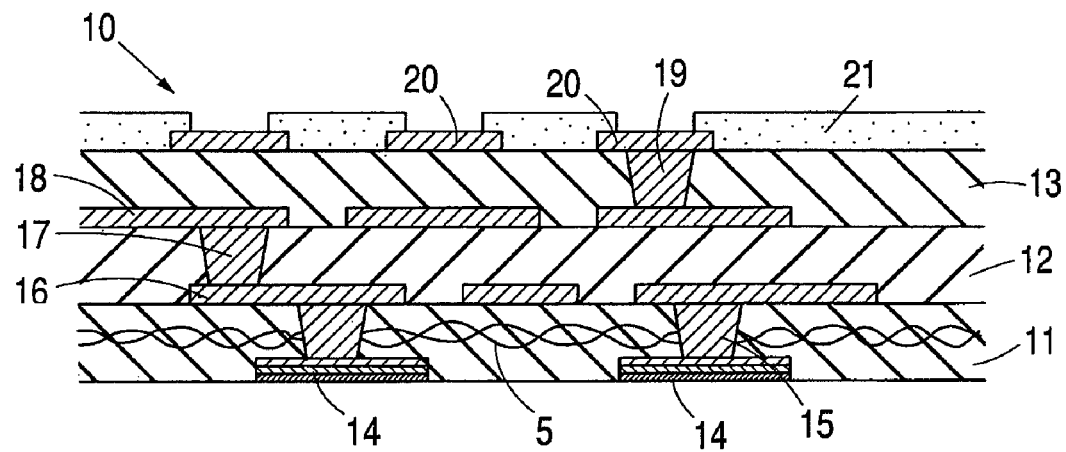

FIG. 7B shows the multilayer wiring substrate 10 obtained when the supporting metal plate 30a is removed by applying chemical etching.

In the present embodiment, the copper plate is used as the supporting metal plates 30a, 30b respectively. The copper plate can be melted simply by the etching and removed, and the outer surface of the first wiring pattern 14 acting as the pads is formed of the gold plating layer 14a. Therefore, the first wiring pattern 14 is not affected upon applying the chemical etching to the supporting metal plates 30a, 30b, and only the supporting metal plates 30a, 30b can be selectively etched and removed.

In this manner, it is advantageous that the metal that can be selectively etched not to affect the first wiring pattern 14 acting as the pads, to which the external connection terminals are bonded, should be selected as the supporting metal plates 30a, 30b.

According to the method of manufacturing the multilayer wiring substrate according to the present embodiment, the wiring layers are formed in a multi-layered fashion while supporting firmly the wiring layers by the supporting metal plates 30a, 30b. Therefore, the multilayer wiring substrate can be manufactured not to cause the wiring layers and the insulating layers to deform during the manufacturing steps, and the wiring patterns can be formed with high accuracy. Also, the multilayer wiring substrate obtained by etching the supporting metal plates 30a, 30b has the insulating layer containing the glass cloth. Therefore, the multilayer wiring substrate that can suppress a deformation such as a warp can be provided. Also, there are such advantages that the wiring layers can be formed in a multi-layered structure by utilizing the conventional build-up method, etc., except that the resin film containing the glass cloth (the resin material) is used.

In the above embodiment, the multilayer wiring substrate in which the wiring layers are formed as a four-layered structure is illustrated. But the number of wiring layers constituting the multilayer wiring substrate is not particularly restricted. Also, the properties of the insulating materials used in the insulating layer containing the glass cloth, the characteristics of the glass cloth, the fiber diameter, the weave, etc. are not particularly restricted.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A multilayer wiring substrate having no core substrate, comprising:
   a laminated body comprising:
      a plurality of insulating layers; and
      a plurality of wiring layers,
   wherein the laminated body has:
   a mounting surface on which a semiconductor element is mounted; and
   a bonding surface to which external connection terminals are bonded,
   wherein at least one of the insulating layers contains a glass cloth,
   wherein a first insulating layer that is adjacent to the bonding surface includes:
      external connection terminal pads; and
      vias electrically connected to the external connection terminal pads and formed through the first insulating layer in a thickness direction thereof,
   wherein the surfaces of the external connection terminal pads are exposed from the first insluting layer, and
   wherein the thickness of the insluting layer containing the glass cloth is larger than those of the other insulating layers and a clearance between the glass cloth and a surface of the insluting layer containing the glass cloth is 10 μm or more.

2. A multilayer wiring substrate having no core substrate, comprising:
   a laminated body comprising:
      a plurality of insulating layers; and
      a plurality of wiring layers,
   wherein the laminated body has:
   a mounting surface on which a semiconductor element is mounted; and
   a bonding surface to which external connection terminals are bonded,
   wherein a first insulating layer that is adjacent to the bonding surface contains a glass cloth,
   wherein only the first insulating layer contains the glass cloth, and the other insulating layers do not contain the glass cloth,
   wherein the first insulating layer includes:
      external connection terminal pads; and
      vias electrically connected to the external connection terminal pads and formed through the first insulating layer in a thickness direction thereof,
   wherein the surfaces of the external connection terminal pads are exposed from the first insluting layer, and
   wherein the thickness of the first insulating layer is larger than those of the other insulating layers and a clearance between the glass cloth and a surface of the first insluting layer is 10 μm or more.

3. The multilayer wiring substrate according to claim 2, wherein a thickness of the first insulating layer is 50 μm or more.

4. The multilayer wiring substrate according to claim 2, wherein a wiring ratio of the first insulating layer is the lowest of the plurality of insulating layers.

* * * * *